(12) United States Patent
Durham et al.

(10) Patent No.: US 6,818,525 B1
(45) Date of Patent: Nov. 16, 2004

(54) SEMICONDUCTOR DEVICE AND METHOD OF PROVIDING REGIONS OF LOW SUBSTRATE CAPACITANCE

(75) Inventors: James A. Durham, Mesa, AZ (US); Keith Kamekona, Scottdale, AZ (US); Brian Schoonover, Gilbert, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/632,636

(22) Filed: Aug. 4, 2003

Related U.S. Application Data

(62) Division of application No. 10/102,505, filed on Mar. 20, 2002, now Pat. No. 6,661,068.

(51) Int. Cl.[7] ................................................ H01L 21/76
(52) U.S. Cl. ........................................ 438/421; 438/770
(58) Field of Search ............................... 438/411, 421, 438/619, 770

(56) References Cited

U.S. PATENT DOCUMENTS 5,240,875 A * 8/1993 Tsou ........................... 438/421

* cited by examiner

*Primary Examiner*—Michael Tokar
*Assistant Examiner*—Lisa Kilday
(74) *Attorney, Agent, or Firm*—James J. Stipanuk

(57) ABSTRACT

A semiconductor structure (1), comprising a isolation region (5) formed on a semiconductor material (10). A pillar (15) is formed in the semiconductor material under the isolation region, where the pillar is capped with a first dielectric material (20) to form a void (16).

15 Claims, 4 Drawing Sheets

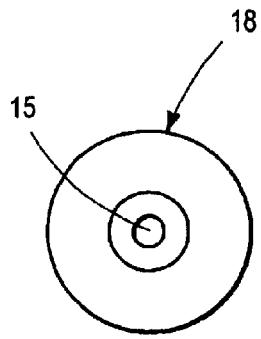 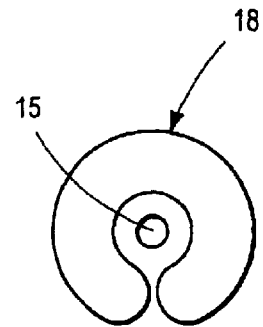 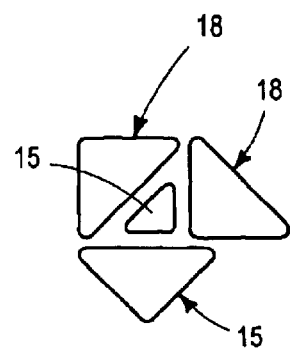
FIG. 7A   FIG. 7B   FIG. 7C
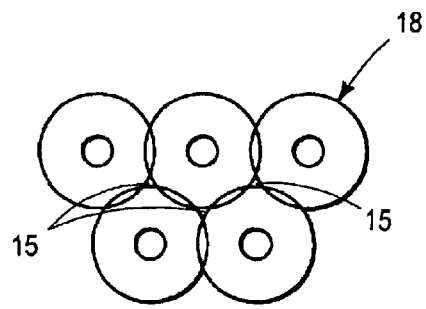
FIG. 7D
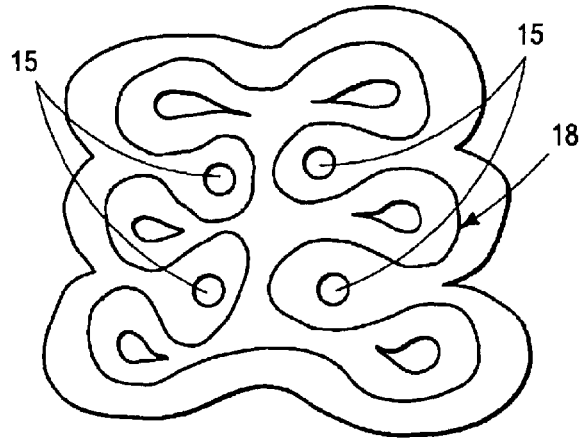
FIG. 7E

SEMICONDUCTOR DEVICE AND METHOD OF PROVIDING REGIONS OF LOW SUBSTRATE CAPACITANCE The present application is a Division based on prior U.S. application Ser. No. 10/102,505, filed on Mar. 20, 2002 now U.S. Pat. No. 6,661,068, which is hereby incorporated by reference, and priority thereto for common subject matter is hereby claimed.

BACKGROUND OF THE INVENTION

The present invention relates in general to semiconductor devices and, more particularly, to integrated circuits having components formed on a low capacitance region of a semiconductor die.

Semiconductor technology continues to scale transistors to have smaller dimensions in order to provide increased functionality and a higher frequency capability. For example, wireless communication devices often use integrated circuits that include high density digital signal processing functions on the same die as analog circuits operating at frequencies in excess of five gigahertz.

However, some integrated circuit components, such as passive devices, are not readily scalable. These devices have relatively high parasitic substrate capacitances, which often limits the overall frequency capability of an integrated circuit. For example, inductors are not easily reduced in size without reducing their quality factor or inductance to an unacceptable level, and bonding pads are not scalable because of the need to attach wire bonds to the bonding pads.

A variety of techniques have been tried to reduce the parasitic capacitances of passive integrated circuit components. One such technique is to form the components over a low permittivity material. However, current low permittivity materials are limited to film thicknesses that are too thin to produce an adequate reduction in parasitic capacitance. Another approach is to form the components over a thick dielectric film in which are formed air gaps or voids that reduce the overall permittivity of the dielectric film. However, previous films made with such voids introduce substantial stress in a semiconductor substrate, which degrades the performance and reliability of the integrated circuit. Other schemes reduce the stress by producing fewer voids or voids with only a limited volume, which has a correspondingly limited effect on parasitic capacitance. Another issue with previous art has been the high costs associated with the complex patterning and etching steps to produce isolation structures with large void to pillar ratios.

Hence, there is a need for a low capacitance structure and method of making a semiconductor device that maintains a low cost while reducing die stress and avoiding the introduction of contaminants into the integrated circuit.

BRIEF DESCRIPTION OF THE DRAWINGS

FIG. 7A is a top view of a first alternate embodiment of the semiconductor device;

FIG. 7B is a top view of a second alternate embodiment of the semiconductor device;

FIG. 7C is a top view of a third alternate embodiment of the semiconductor device;

FIG. 7D is a top view of a fourth alternate embodiment of the semiconductor device;

FIG. 7E is a top view of a fifth alternate embodiment of the semiconductor device; and

DETAILED DESCRIPTION OF THE DRAWINGS

In the figures, elements having the same reference number have similar functionality.

Figure 1A:
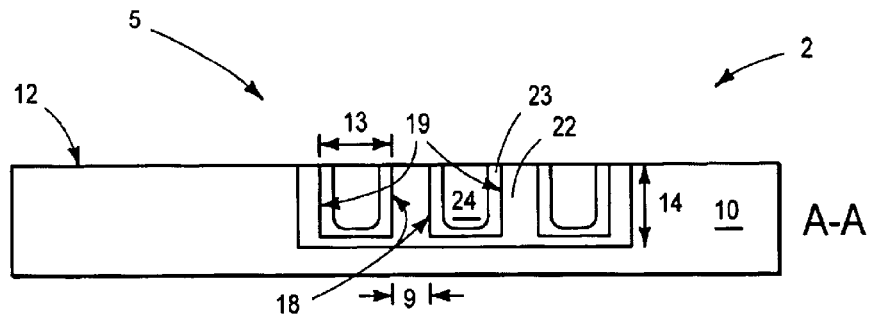
FIG. 1A is a first cross-sectional view of a semiconductor device after a first fabrication stage.
Figure 1B:
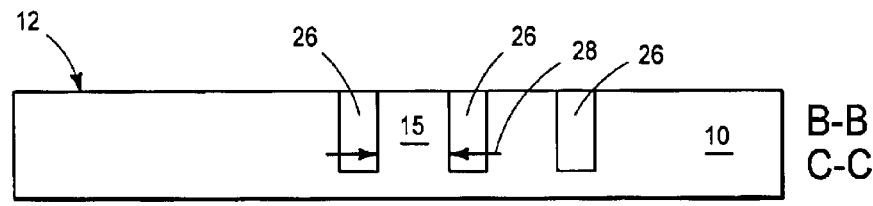
FIG. 1B is a second cross-sectional view of the semiconductor device after the first fabrication stage.
Figure 2:
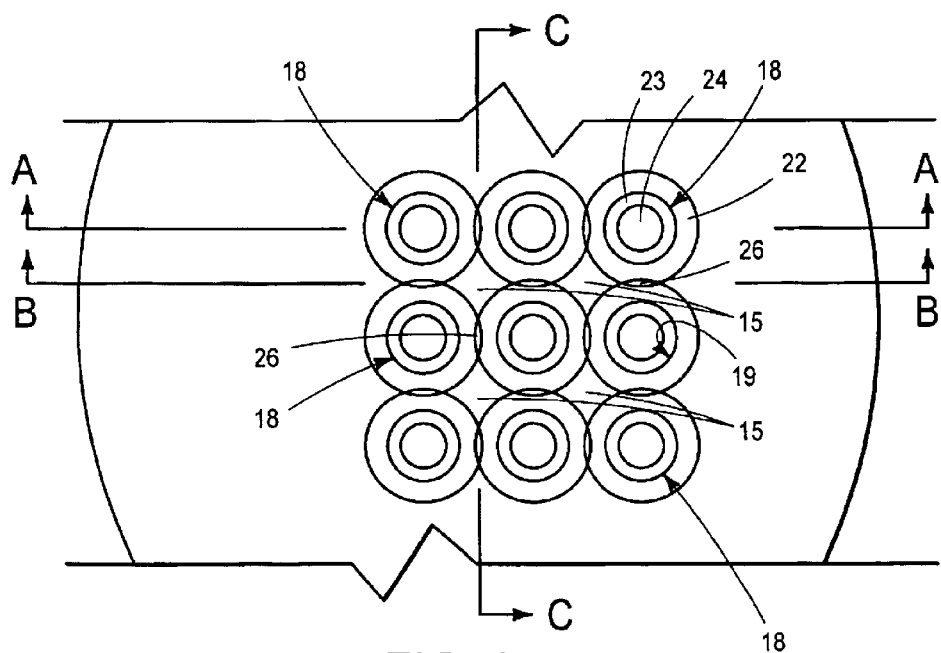
FIG. 2 is a top view of the semiconductor device after the first fabrication stage.

FIGS. 1A, 1B, and 2 are used to describe a first processing stage, and should be referred to collectively for the description, which follows. FIG. 1A is a first cross-sectional view AA of a semiconductor device 1 after a first fabrication stage, FIG. 1B is a second cross-sectional view BB and/or CC of semiconductor device 1 after the first fabrication stage, and FIG. 2 is a top view of semiconductor device 1 after the first fabrication stage.

Semiconductor device or structure 1 is formed with a semiconductor substrate material 10 and includes an isolation region 5 for forming electrical components such as passive devices and bonding pads. Semiconductor device 1 further includes an active region 2 for forming a transistor 3 and/or other active devices. In one embodiment, semiconductor substrate material 10 comprises monocrystalline silicon.

For the purposes of simplifying the description of the invention, semiconductor substrate material 10 is shown as a single layer. However, semiconductor substrate material 10 typically includes a series of layers for producing active devices in region 2 such as base, epitaxial, and dielectric layers (not shown).

A surface 12 of semiconductor substrate material 10 is patterned with photoresist to mask an series of standard etch steps that remove exposed portions of the dielectric layers described above (not shown). A standard anisotropic silicon etch is then applied to remove exposed portions of the epitaxial layer and base layer (not shown) to forms an array of cavities 18 within isolation region 5. In one embodiment, cavities 18 are formed to a depth 14 of about five micrometers, a width 13 of about one micrometer and about one micrometer of separation 9 between adjacent cavities 18 using a standard silicon reactive ion etch with nitrogen trifluoride gas for about seven minutes.

Semiconductor device 1 is then thermally oxidized to simultaneously grow an extrinsic layer 23 of silicon dioxide on the sidewalls 19 of cavities 18. A thermally grown silicon dioxide oxidizes the sidewalls 19 of the cavities 18 and consumes a portion of sidewalls 19 to form an intrinsic layer 22 of silicon dioxide. A portion 24 of the cavities 18 is not filled with silicon dioxide. Between cavities 18, overlapping regions 26 of consumed portions or intrinsic layer 22 are formed. Although shown as two layers for the purposes of describing the invention, layer 22 and layer 23 constitute a homogeneous or single continuous layer. Note that the pillars 15 of semiconductor substrate material 10 are not consumed by the formation of intrinsic layer 22. Thus a homogeneous or single continuous layer of silicon dioxide comprised of extrinsic layer 23 and intrinsic layer 22 is formed surrounding pillars 15 of semiconductor material. Since the oxidation rate of semiconductor established and easily controlled, the pillars 15 can be easily controlled.

Figure 3A:
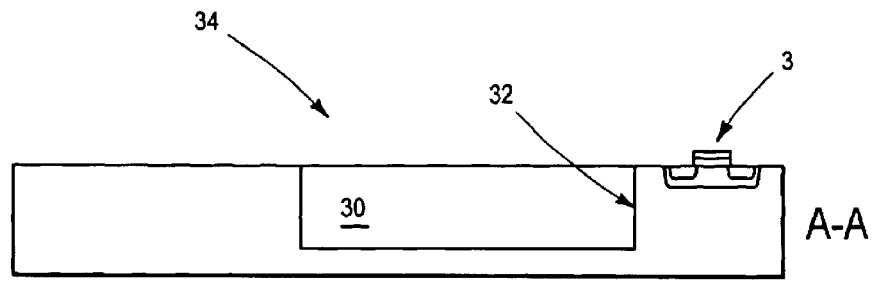
FIG. 3A is a first cross-sectional view of the semiconductor device after a second fabrication stage.
Figure 3B:
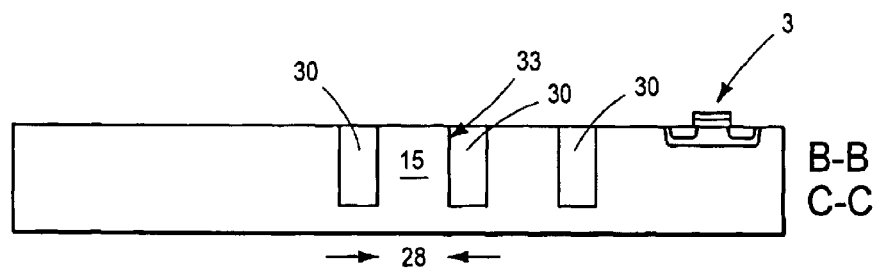
FIG. 3B is a second cross-sectional view of the semiconductor device after the second fabrication stage.
Figure 4:
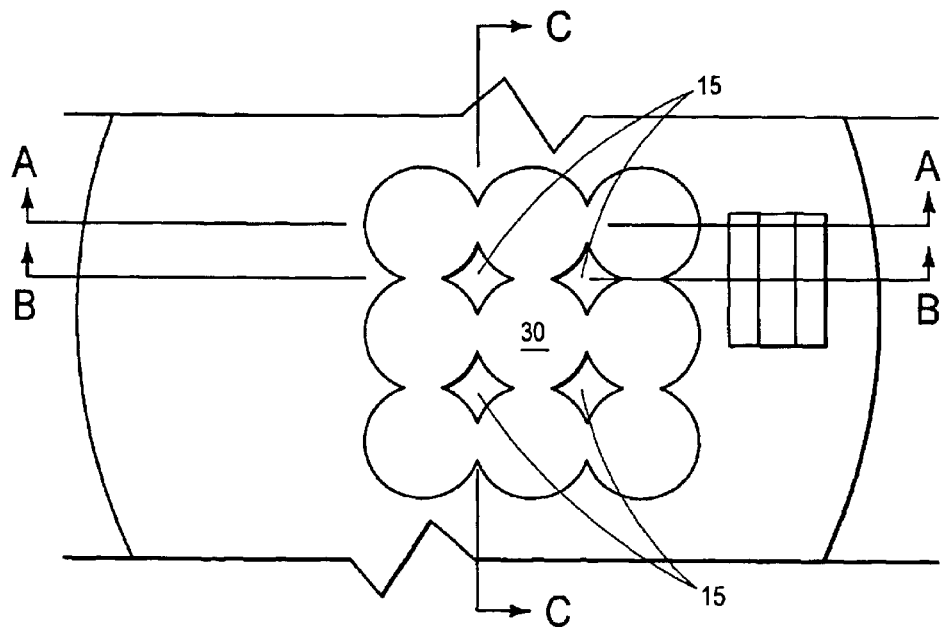
FIG. 4 is a top view of the semiconductor device after the second fabrication stage.

FIGS. 3A, 3B, and 4 are used to describe a second processing stage, and should be referred to collectively for the description, which follows. FIG. 3A is a first cross-sectional view AA of semiconductor device 1 after a second fabrication stage, FIG. 3B is a second cross-sectional view BB and/or CC of semiconductor device 1 after the second fabrication stage, and FIG. 4 is a top view of semiconductor device 1 after the second fabrication stage.

Semiconductor substrate material 10 is subjected to an etch step to remove portion of extrinsic layer 23 and intrinsic layer 22. In one embodiment, the etch is performed by a timed wet etch of buffered oxide etch solution for about ten minutes. In an alternate embodiment, a portion (not shown) of intrinsic layer 22 can be left as an etch stop or reinforcement material by reducing the amount of the material removed by the etch, as long as an overlapping region 26 is removed to form the pillars 15. Thus the pillars 15 are now left free standing in a recessed region 30.

A problem of the prior art has been controlling etch processes used to form a small pillar in a recess. In prior art, when the recessed regions get large in relation to the pillar, the lack of controllability results in a missing, deformed, or weakened pillar. These defects reduce production yields and increase manufacturing costs. In addition, advanced photolithographic and etching equipment required to form a small pillar is expensive to purchase, operate and maintain.

One advantage of the invention over prior art is that the feature size or width 28 of the pillar 15 is primarily determined by the easily controlled oxidation rate of the semiconductor substrate material 10, rather than the etch rate of the semiconductor substrate material 10. This enables use of less expensive photolithographic and etching tools to form feature sizes which are smaller than the photolithographic capabilities of the tools, while easily controlling the process to produce a pillar with fewer defects.

Figure 5A:
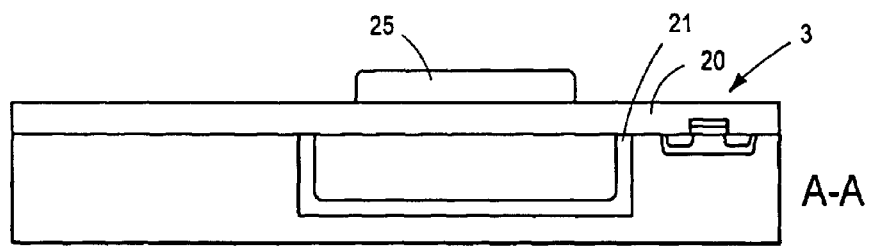
FIG. 5A is a first cross-sectional view of the semiconductor device after a third fabrication stage.
Figure 5B:
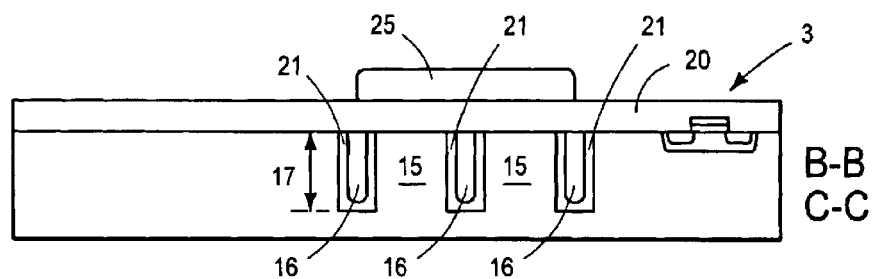
FIG. 5B is a second cross-sectional view of the semiconductor device after the third fabrication stage.
Figure 6:
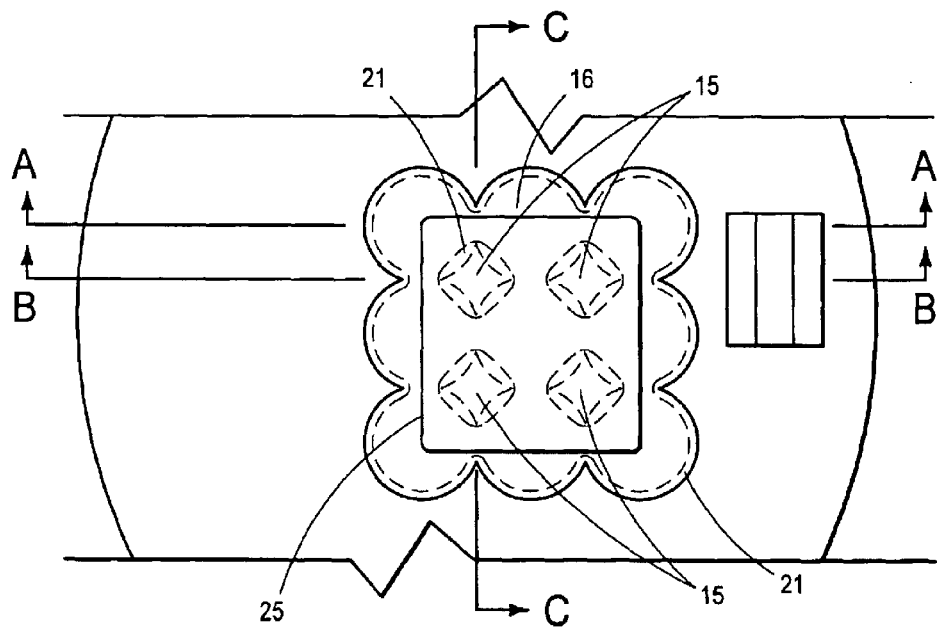
FIG. 6 is a top view of the semiconductor device after the third fabrication stage.

FIGS. 5A, 5B, and 6 are used to describe a third processing stage, and should be referred to collectively for the description, which follows. FIG. 5A is a first cross-sectional view AA of semiconductor device 1 after a third fabrication stage, FIG. 5B is a second cross-sectional view BB and/or CC of semiconductor device 1 after the third fabrication stage, and FIG. 6 is a top view of semiconductor device 1 after the third fabrication stage.

A dielectric layer 21 is formed in recessed region 30 to provide a coating to reinforce pillar wall 33 and recessed region wall 32 and to promote adhesion of subsequent layers to the semiconductor substrate material 10. In the case where reinforcement or improved adhesion is not required, layer 21 can be omitted in order to reduce costs. In one embodiment dielectric layer 21 is formed to a thickness of about five hundred angstroms of thermally grown silicon dioxide. In an alternate embodiment, dielectric layer 21 is formed of silicon nitride to a thickness of approximately five hundred angstroms.

A cap layer or dielectric material 20 is deposited on substrate surface 12 capping pillars 15 to form a seal over recessed region 30 creating void 16. In one embodiment, dielectric material 20 is formed of plasma enhanced chemical vapor deposition (PECVD) silicon dioxide to a thickness of approximately ten thousand angstroms. In an alternate embodiment, dielectric material 20 is formed of silicon nitride to a thickness of approximately ten thousand angstroms.

In one embodiment, void 16 has a depth 17 beneath surface 12 of approximately five micrometers.

Void 16 is so designated because it is filled with a gaseous material, which in one embodiment may be air. Void 16 may also be filled with argon or another ambient gas which is present when opening 34 of recessed region 30 becomes sealed off.

An electrical component 25 is formed on dielectric material 20 over isolation region 5. Electrical component 25 may be a bonding pad, a passive component such as an inductor, capacitor or resistor, or another electrical device suitable for formation over a dielectric material.

The effective dielectric constant of isolation region 5 is a combination of the dielectric constant or permittivity of void 16 and the permittivity of the materials used to form pillars 15 and dielectric material 21. In one embodiment, the gaseous material contained in void 16 has a dielectric constant substantially equal to one, and dielectric material 21 has a dielectric constant of about 3.8, thus the overall dielectric constant of the isolation region formed is less than 3.8, depending on the relative volumes of the pillars 15, dielectric material 21 and void 16. Electrical component 25 has a low parasitic capacitance to substrate 10, and therefore a higher frequency capability, because of the low permittivity of isolation region 5. Hence, isolation region 5 has a low effective permittivity for forming electrical components with a low parasitic substrate capacitance.

Although FIG. 1 through FIG. 6 show pillars 15 as being formed using circular cavities 18, other cavity shapes, arrangements, and quantities can be used to realize pillar formation. FIG. 7A through 7E are used to show some of the many alternate embodiments of the invention possible by varying the shape and quantity of cavities 18 used to subsequently form pillars 15. For example, FIG. 7A shows an embodiment having a single donut shaped cavity 18 in which pillar 15 is formed. FIG. 7B shows an embodiment having a unshaped cavity 18 in which pillar 15 is formed using the invention. FIG. 7C shows an embodiment having multiple triangle shaped cavities 18 in which pillar 15 is formed. FIG. 7D shows an embodiment having multiple staggered cavities 18 in which pillars 15 are formed. FIG. 7E shows an embodiment having a multiplicity of u-shaped cavities 18 in which pillars 15 are formed using the invention.

In summary, the present invention provides a semiconductor structure (1), comprising a isolation region (5) formed above a semiconductor material (10) with a pillar (15) formed of the semiconductor material under the isolation region. The pillar is capped with a dielectric material (20) to form a void.

What is claimed is:

1. A method of making a semiconductor structure, comprising the steps of: oxidizing sidewalls of cavities in a semiconductor material to form a continuous oxide layer between adjacent cavities, thereby forming a pillar of the semiconductor material; and etching the continuous oxide layer between said adjacent cavities.

2. The method of claim 1, wherein the cavities are formed in a region of the semiconductor material, further comprising the step of depositing a dielectric material over the region to form a void adjacent to the pillar.

3. A method of making a semiconductor structure, comprising:

forming a pillar with a semiconductor material below a surface of a substrate;

capping the pillar with a first dielectric material to form a void; and forming an electrical component on the dielectric material over the void.

4. The method of claim 3, wherein the electrical component comprises a passive device or bonding pad.

5. The method of claim 4, wherein the semiconductor material comprises monocrystalline silicon.

6. The method of claim 3, wherein the step of capping the pillar includes the step of coating the pillar with a second dielectric material.

7. The method of claim 6, wherein the second dielectric material comprises thermally grown oxide or silicon nitride.

8. The method of claim 7, wherein the first dielectric material comprises deposited silicon dioxide.

9. The method of claim 3, wherein the void is formed having a depth of at least five micrometers below the surface of the semiconductor material.

10. The method of claim 3, wherein the pillar is formed having a height of at least five micrometers below the surface of the semiconductor material.

11. A method of making a semiconductor device, comprising:

forming a silicon pillar below a surface of a semiconductor substrate;

capping the silicon pillar with a first dielectric material to form a void; and forming an electrical component over the void.

12. The method of claim 11, wherein the silicon pillar is formed to a height of greater than five micrometers.

13. The method of claim 12, wherein the step of capping the silicon pillar includes the step of coating the silicon pillar with a second dielectric layer.

14. The method of claim 13, wherein the second dielectric material is comprised of deposited silicon dioxide or silicon nitride.

15. The method of claim 11, wherein the electrical component comprises a passive device or bonding pad.

* * * * *